United States Patent [19]
Kita et al.

[11] 4,317,022
[45] Feb. 23, 1982

[54] ELECTRON BEAM WELDING MACHINE

[75] Inventors: Hisanao Kita, Hitachi; Yoshinori Karatsu; Takamitsu Nakazaki, both of Takahagi; Yoji Akutsu, Hitachi, all of Japan

[73] Assignee: Hitachi, Ltd., Tokyo, Japan

[21] Appl. No.: 208,428

[22] Filed: Nov. 19, 1980

[30] Foreign Application Priority Data

Nov. 19, 1979 [JP] Japan ................. 54-148914

[51] Int. Cl.³ ............................. B23K 27/00
[52] U.S. Cl. ............... 219/121 EU; 219/121 EC; 219/121 EH; 219/121 EX
[58] Field of Search ............... 219/121 EB, 121 EM, 219/121 EV, 121 EC, 121 ED, 121 EH, 121 EJ, 121 EK, 121 ER, 121 EU, 121 EX

[56] References Cited

U.S. PATENT DOCUMENTS

| | | | |
|---|---|---|---|
| 3,049,608 | 8/1962 | Greene | 219/121 EC |
| 3,082,316 | 3/1963 | Greene | 219/121 EC |
| 3,134,013 | 5/1964 | Opitz et al. | 219/121 EU X |
| 3,378,670 | 4/1968 | Smith et al. | 219/121 EU X |
| 3,479,483 | 11/1969 | Boring et al. | 219/121 EU X |
| 3,483,350 | 12/1969 | Pohl | 219/121 EW X |
| 3,601,577 | 8/1971 | Meyer et al. | 219/121 EU X |
| 3,617,686 | 11/1971 | Dietrich | 219/121 EB |

FOREIGN PATENT DOCUMENTS

963833 7/1964 United Kingdom .

*Primary Examiner*—C. L. Albritton
*Attorney, Agent, or Firm*—Thomas E. Beall, Jr.

[57] ABSTRACT

An electron beam welding machine comprises an electron gun including a first beam adjusting means, a second beam adjusting means disposed spaced from the first beam adjusting means so as to be movable in the direction of an electron beam path, and position adjusting means for adjusting the position of the second beam adjusting means through rotary movement about an axis perpendicularly crossing the electron beam path and linear movements on a plane perpendicular to the electron beam path. The machine further includes a mirror and light source mounted on the electron gun to emit light on the electron beam path, and photodetectors mounted on the opposite sides of the second beam adjusting means so as to face the electron gun and a workpiece, whereby the correct position of the second beam adjusting means is detected.

13 Claims, 1 Drawing Figure

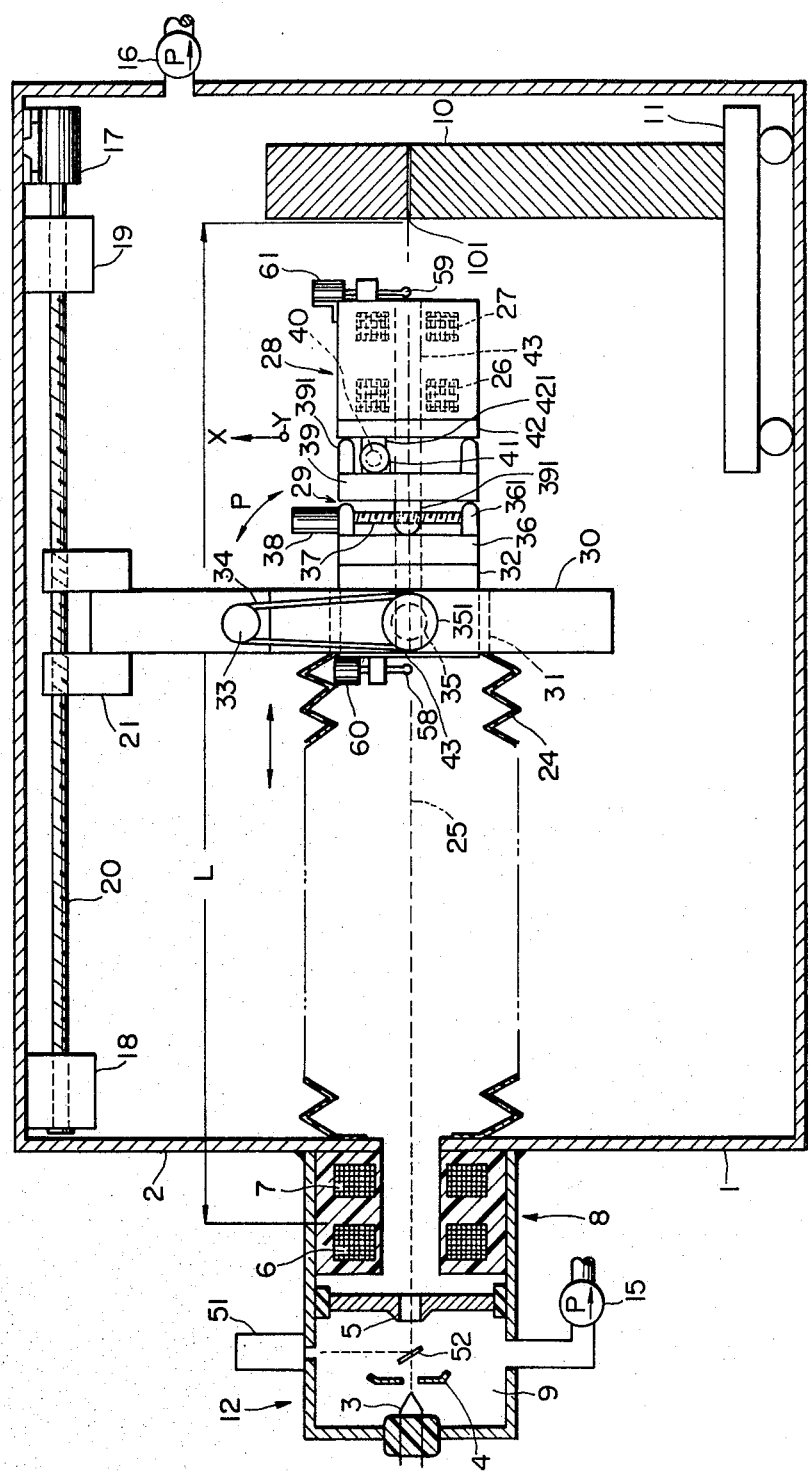

ns of 100 mm or more can not be effected satisfactorily.

ELECTRON BEAM WELDING MACHINE

BACKGROUND OF THE INVENTION

This invention relates to an electron beam welding machine and more particularly to an electron beam welding machine which has a second beam adjusting means located between the electron gun with a first beam adjusting means and a workpiece.

In conventional electron beam welding machine, an electron gun is mounted on a welding chamber in which a workpiece is located and comprises a cathode, grid, anode, and a beam adjusting means including a focusing coil and a deflecting coil. A beam generator is contained in a vacuum chamber of the electron gun and the electron beams are directed towards the workpiece through an aperture in the wall of the welding chamber. Such a machine is disclosed, for example, in U.S. Pat. No. 3,617,686.

In such machines, it is generally necessary to evacuate the welding chamber and the electron beam gun chamber by means of a vacuum pump and to maintain them at high vacuum of about $1 \times 10^{-4}$ Torr and about $1 \times 10^{-5}$ to $1 \times 10^{-6}$ Torr, respectively. However, gases contained in the workpiece such as $H_2$ and $O_2$ and the material of the workpiece itself converted into metal vapor are emitted from the surface of the workpiece during welding and eventually lower the vacuum in both vacuum chambers. If a large number of molecules enter the electron beam gun chamber the insulation effect of the vacuum in the proximity of anode and cathode is reduced, so that microdischarge and flash-over discharge occur. Microdischarge results in the formation of blow-holes at the weld zone while flash-over discharge leads to the formation of recesses of the surface beads, blow-holes and sags. If flash-over discharge occurs, furthermore, an excess current relay operates to stop operation of the apparatus in order to protect it.

These discharge phenomena occur frequently when the thickness of the workpiece exceeds 100 mm because the number of gas molecules and metal vapor molecules formed during welding increases with increasing thickness of the workpiece. When a 100 mm thick killed steel is welded, for example, microdischarge occurs 1 to 5 times within 10 minutes and the flash-over discharge occurs about once in 20 minutes. The vacuum in this instance is $1 \times 10^{-3}$ Torr near the aperture in the wall of the welding chamber, $1 \times 10^{-2}$ Torr near the workpiece and $10^{-5}$ to $10^{-6}$ Torr inside the electron beam gun chamber. Thus, the pressure ratio between the region near the aperture in the welding chamber and the electron beam gun chamber may be as large as $10^2$–$10^3$, so that the gas and metal molecules are liable to be sucked into the electron beam gun chamber. In consequence, molecules emitted from the surface of the workpiece enter the electron beam gun chamber and instantaneously reduce the vacuum near the anode and cathode down to $10^{-3}$–$10^{-4}$ Torr, thereby causing the discharge phenomena. Because of such discharge phenomena, it has been difficult in the conventional machines to weld, cut or bore a workpiece of a thickness of 100 mm or more by means of electron beams.

There is a prior art of an electron beam welding machine which has two beam adjusting means spaced from each other, which prior art is disclosed in GB patent specification No. 963,833.

The means, however are fixed so that the distance between the two means will not be changed. Therefore it seems that treatment of a thick workpiece of a thickness of 100 mm or more can not be effected satisfactorily.

SUMMARY OF THE INVENTION

An object of the invention is to provide an electron beam welding machine which can be used for welding, cutting or boring workpieces of various thickness, particularly thick workpieces without causing discharge phenomena during its process.

Another object of the invention is to provide an electron beam welding machine in which second beam adjusting means is provided movably along an electron beam path to prevent electric discharge during the welding process, and can be easily adjusted and brought into complete alignment with the electron beam path so as to obtain sound welds.

Further another object of the invention is to provide an electron beam welding machine which makes it possible that second beam adjusting means is correctly adjusted and aligned with an electron beam path.

Discharge near the anode and cathode of the electron beam gun with a first beam adjusting means occurs because gas molecules (including metal vapor molecules) generated at the workpiece during treatment such as welding, cutting or boring reach the electron beam gun. Molecules emitted from the surface of the workpiece with kinetic energy can travel only their free path. If the workpiece is spaced from the electron beam gun by a distance greater than the mean free path of these molecules therefore, the number of molecules capable of reaching the electron beam gun is much reduced so that the discharge phenomena can be checked. This is disclosed in copending U.S. patent application "Method of treating a workpiece with electron beams and apparatus therefor" filed on Mar. 19, 1980 by the same inventors.

When the workpiece is spaced from the electron beam gun by such a distance, for example, 1.3 m, it is necessary to provide a second beam adjusting means for preventing electron beams from scattering on the electron beam path so as to be movable along the path. For the second beam adjusting means, it is necessary to align precisely with a line between the electron gun and the position of the workpiece to be treated.

An electron beam welding machine according to the present invention, therefore, comprises an electron gun with a beam adjusting means, a second beam adjusting means movable along an electron beam path, and means for mechanically adjusting the position of the second beam adjusting means. A feature of the present invention is that the mechanical adjusting means comprises first position adjusting means for moving the second beam adjusting means on a plane perpendicular to a line between the electron gun and a position of a workpiece to be treated, and second position adjusting means for rotating the second beam adjusting means about an axis perpendicularly crossing the line together with the first position adjusting means.

Another feature of this invention comprises: a light source provided to the electron gun to form a light path coaxial with the electron beam path; and two photodetectors fitted to the second beam adjusting means, one on the side facing the electron gun and the other on the side facing the workpiece, both being able to be adjusted and located on the beam path so as to check, before starting welding, that the second beam adjusting means has been brought into complete alignment with the electron beam.

BRIEF DESCRIPTION OF THE DRAWING

The FIGURE is a sectional view of an electron beam welding machine according to the invention.

DESCRIPTION OF THE PREFERRED EMBODIMENTS

An embodiment of an electron beam welding machine will be described hereinafter in detail, referring to the FIGURE on the accompanying drawing.

In the FIGURE, an electron beam welding machine according to the invention is shown. An electron gun 12 is mounted airtightly on the wall 2 of a vacuum welding chamber 1 for placing a workpiece 10 therein, and comprises a cathode 3, a gride 4, an anode 5, and a first beam adjusting means 8 comprising a focusing coil 6 and deflection coil 7. A beam generator is contained in a vacuum chamber 9 of the electron gun and kept at high vacuum, for example, about $1 \times 10^{-5}$ Torr by a vacuum pump 15. The electron gun 12 emits an electron beam into the welding chamber 1 through an aperture of wall 2, and the electron beam directs to a position 101 of the workpiece 10 to be welded. The welding chamber 1 is evacuated by a vacuum pump 16. On the electron beam path 25 between the first beam adjusting means 8 and the workpiece 10, a second beam adjusting means 28 is disposed to constrict a diffused beam and focus it on the desired spot 101 on the workpiece 10. Distance L between the first beam adjusting means 8 and the workpiece 10 is set more than 1.3 m. The second beam adjusting means 28 comprises a focusing coil 26 to concentrate the electron beam 25 and a deflection coil 27, and it is mounted on a position setting arm 20 through a position adjusting means 29.

The position setting arm 20 is rotatably suported by a pair of bearings 18,19 secured to the upper portion of the welding chamber 1. The arm 20 which is fixed to a motor 17 at the one end is threaded between the bearings 18 and 19 and engaged with a pair of members 21 of a coupler 30 of the position adjusting means 29. The position adjusting means 29 is moved by the arm 20 which is rotated by the motor 17 so that the second beam adjusting means 28 moves along the path 25. The coupler 30 has a hole 31 into which a mounting base 32 is inserted with a play. The mounting base 32 has a shaft 35 extending perpendicular to the beam path 25 and plane of the FIGURE. The shaft 35 is inserted rotatably in a pair of bearings in the side wall of the coupler hole 31. One end of the shaft 35 is provided with a pulley 351, and driven by a motor 33 through the belt 34 so that the second beam adjusting means 28 can be rotated about the shaft 35 as indicated by the arrow P to adjust the direction of the electron beam path 25. The mounting base 32 is fitted with a seat 36 in which a ball screw 37 fitted coaxial with a motor 38 is rotatably mounted on the projections 361. On the projections of the seat 36, another seat 39 is mounted. The seat 39 has a boss 391 extending toward the seat 36. The boss 391 has a screw made therein and is engaged with the ball screw 37 whereby the seat 39 is displaced in the direction of X-axis as indicated by the arrow X according to the rotation of the motor 38. The seat 39 also has projections 391 mounting thereon a mount 42 securing the second beam adjusting means 28. The seat 39 is provided with a ball screw 40 extending perpendicularly to the direction of the ball screw 37 disposed coaxially with a motor 41, and engaged with a boss 421 of the mount 42 so that as the motor 41 rotates the mount 42 is displaced in the direction of Y axis (perpendicular to the surface of the drawing).

The base 32, the seats 36, 39, and mount 42 each have a hole 43 at their center through which the electron beam 25 passes. The shafts of the ball screws 37, 40 are installed at the position deviated from the path 43.

The beam path 25 between the wall 2 of the welding chamber 1 and the position adjusting means 29 is surrounded by a bellows or the like 24, which bellows 24 is airtightly mounted on the wall 2 of the welding chamber 1 and the coupler 30.

With this electron beam welding machine, since the distance L between the first beam adjusting means 8 and the workpiece 10 can be set longer than 1.3 m, by moving a carriage 11 carrying thereon the workpiece 10, gases coming out of the weld portion can be prevented from entering the electron gun 12, resulting in a sound weld. Furthermore, since the second beam adjusting means 28 can be displaced along the path of the electron beam 25 to a desired position by rotating the position setting arm 20, the electron beam can be focused accurately on the weld portion 101, thus producing sound, deeply penetrating welds.

The electron beam welding machine of this invention also has the following advantage. The second beam adjusting means 28 is mounted to the position setting arm 20 through the position adjusting means 29 including the adjusting mechanisms such as the rotary adjusting mechanism made up of the motor 33 and belt 34, the X-axis adjusting mechanism driven by the motor 38 and ball screw 37, and the Y-axis adjusting mechanism driven by the motor 41 and ball screw 40. Therefore, if the position setting arm 20, the position adjusting means 29 or the second beam adjusting means 28 was not assembled to the exactly correct position, the center of magnetic field of the second beam adjusting means 28 can be aligned with the electron beam 25 by moving the means 28 in the directions of X and Y axes or by rotating it. Thus, with this invention, it is possible to perform the electron beam welding under best condition by setting the electron gun far enough from the workpiece and by accurately focusing the beam on the desired point of target.

The electron gun 12 is further equipped with a laser oscillator 51 as a light source and with a mirror 52 for directing the laser beam from the laser oscillator 51 along the path which is coaxial with the electron beam path 25. The mirror 52 is mounted shiftably in the direction perpendicular to the beam path 25.

The second beam adjusting means 28 has two photodiodes 58, 59, one photodiode 58 being fitted thereto through the coupler 30 and the other 59 being fitted to the underside of the deflection coil 27 (or the right end in the drawing) facing the workpiece 10. These photodiodes 58, 59, which work as detectors of laser beam, are moved by the motors 60, 61 so that the photodiodes can be positioned on the central axis of the electron beam hole in the coupler 30 and on the central axis of the hole in the deflection coil 27. The second beam adjusting means 28 is equipped with the adjusting mechanisms for two directions, X-axis (shown by the arrow X) and Y-axis (shown by the arrow Y), and also with the rotary adjusting mechanism.

To align the center of magnetic field of the second beam adjusting means 28 with the electron beam path 25, the laser beam is aligned with the center of the magnetic field. This process is shown in the following.

First, the photodiode 58 is driven by the motor 60 to the central axis of the electron beam hole 43 of the coupler 30. The X- and Y-axis adjusting mechanisms are then operated to adjust the position of the second beam adjusting means 28 until the laser beam detection output is obtained from the photodiode 58. When the detection output is produced, the second beam adjusting means 28 is in the position in which the laser beam becomes aligned with the electron beam path 25.

Now, the photodiode 58 is returned to its original position by the motor 60, and the photodiode 59 is then driven by the motor 61 to the central axis of the hole 43. The rotary adjusting mechanism 33, 34, 35 is operated to rotate the second beam adjusting means 28 until the photodiode 59 generates the laser beam detection output. When the laser beam detection output is generated, the second beam adjusting means 28 is in the position in which the electron beam is aligned with the central axis of the hole 43 in the deflection coil 27. In this way, prior to the welding, the center of the magnetic field of the second beam adjusting means is aligned accurately with the electron beam path.

Because of this construction, it is possible to align the center of the magnetic field of the second beam adjusting means 28 with the electron beam path 25 by first setting these photodiodes 58, 59 at the central axis of the electron beam holes, by operating the laser oscillator 51 and by adjusting the position of the second beam adjusting means 28 with the adjusting mechanisms until the photodiodes detect the laser beam. The adjustment performed in the above process produces very little electron scattering and the laser beam of high energy is emitted along the path coaxial with that of the electron beam. Therefore, not only can the adjustment very easily be done but it is also possible to check that the device is correctly adjusted prior to the welding process.

Although we have used motor, belt and ball screw as components of the adjusting mechanisms, other devices may of course be used. The laser oscillator as the light source may be replaced by other devices. As the photodetector, such devices as phototransistor and silicon photocell may be used instead of photodiode.

With the electron beam welding device of this invention, very sound welds can be obtained.

What is claimed is:

1. An electron beam welding machine comprising:
a vacuum chamber in which a workpiece is to be located;
electron gun means for producing an electron beam along a path and including first beam adjusting means for modifying said beam, said electron gun being mounted on said vacuum chamber;
second beam adjusting means spaced from said first beam adjusting means and being movably mounted in said chamber for movement along said electron beam path for adjusting said electron beam from said first beam adjusting means so as to direct said beam to a desired spot of the workpiece; and
position adjusting means for adjusting the position of said second beam adjusting means, said position adjusting means including first means for moving said second beam adjusting means in a plane perpendicular to the electron beam path and second means for rotating said second beam adjusting means about an axis perpendicularly crossing the electron beam path.

2. The electron beam welding machine as defined claim 1, wherein said first means for moving said second beam adjusting means includes first and second mechanisms for moving said second beam adjusting means in an X-direction perpendicular to the electron beam path, and in a Y-direction perpendicular to the X-direction, respectively.

3. The electron beam welding machine as defined in claim 2, further including a position setting arm means for moving said second beam adjusting means and said position adjusting means along the electron beam path so that electron beams from said electron gun are focused on the desired spot of a workpiece spaced from said electron gun by a distance greater than mean free path of molecules generated at the workpiece.

4. The electron beam welding machine as defined in claim 1, further including a light source for producing a light beam;
mirror means disposed in said electron gun for directing the light beam along the electron beam path toward the workpiece;
light detecting means disposed on said second beam adjusting means for movement therewith so as to face the workpiece for detecting light on the electron beam path whereby the correct position of said second beam adjusting means is detected.

5. The electron beam welding machine as defined in claim 4, further including second light detecting means disposed on said position adjusting means so as to face said electron gun for detecting light on the electron beam path.

6. The electron beam welding machine as defined in claim 5, wherein said light detecting means each are movable in direction perpendicular to the electron beam path.

7. The electron beam welding machine as defined in claim 6, wherein said light source is a laser oscillator.

8. The electron beam welding machine as defined in claim 3, further including carriage means for supporting the workpiece and being mounted within said chamber for linear movement parallel to said path independently of said position adjusting means and arm means.

9. The electron beam welding machine as defined in claim 8, further including a light source for producing a light beam;
a mirror means disposed in said electron gun for directing the light beam along the electron beam path toward the workpiece;
a light detecting means disposed on said second beam adjusting means for movement therewith so as to face the workpiece for detecting light on the electron beam path whereby the correct position of said second beam adjusting means is detected.

10. The electron beam welding machine as defined in claim 9, further including second light detecting means disposed on said position adjusting means so as to face said electron gun for detecting light on the electron beam path.

11. The electron beam welding machine as defined in claim 10, wherein said light detecting means each are movable in direction perpendicular to the electron beam path.

12. A method of electron beam working a piece of metal, comprising the steps of:
providing a vacuum chamber;
producing an electron beam along a path through said chamber, and modifying said beam within a first beam adjuster located in said chamber;

modifying said beam with a second beam adjuster located in said chamber, spaced from said first beam adjuster, and so that said second beam adjuster is movably mounted with respect to said first beam adjuster;

locating a metal workpiece having a thickness of at least 100 millimeters within said beam path downstream of said first and second adjusters;

adjusting the spacing, as measured along said beam path, between said metal workpiece and said first adjuster a distance greater than the mean free path of molecules emitted from the surface of the workpiece to inhibit the molecules from reaching the electron beam gun and thereby reduce the discharge phenomena; and adjusting the position of the second beam adjuster by first moving said second beam adjuster in a plane perpendicular to the electron beam path to center it with the beam path, and also rotating said second beam adjuster relative to said beam path about an axis perpendicularly crossing the electron beam path for aligning the axis of said second adjuster with said electron beam path.

13. The method according to claim 12, further including the steps of:

maintaining said chamber at a high vacuum of at least about $1 \times 10^{-4}$ Torr.

* * * * *